United States Patent
Werking

(10) Patent No.: US 9,018,937 B2
(45) Date of Patent: Apr. 28, 2015

(54) MEMS-BASED VOLTMETER

(75) Inventor: Paul M. Werking, Rockford, MN (US)

(73) Assignee: Honeywell International Inc., Morristown, NJ (US)

( * ) Notice: Subject to any disclaimer, the term of this patent is extended or adjusted under 35 U.S.C. 154(b) by 557 days.

(21) Appl. No.: 13/352,219

(22) Filed: Jan. 17, 2012

(65) Prior Publication Data

US 2013/0181697 A1 Jul. 18, 2013

(51) Int. Cl.
*G01R 17/02* (2006.01)
*G01R 5/00* (2006.01)
*G01R 19/02* (2006.01)

(52) U.S. Cl.
CPC . *G01R 5/00* (2013.01); *G01R 19/02* (2013.01)

(58) Field of Classification Search
CPC ........ G01R 15/125; G01R 19/02; G01R 5/00; H04R 19/00–19/005
USPC ............................... 324/98, 99 R, 99 D, 76.11
See application file for complete search history.

(56) References Cited

U.S. PATENT DOCUMENTS

| | | | | |
|---|---|---|---|---|
| 5,517,123 A | * | 5/1996 | Zhao et al. | 324/458 |
| 5,617,020 A | * | 4/1997 | Campbell et al. | 324/142 |
| 6,806,717 B2 | * | 10/2004 | Werner et al. | 324/458 |
| 7,055,387 B2 | | 6/2006 | Elliott et al. | |
| 7,098,644 B1 | | 8/2006 | Denison | |
| 7,552,637 B2 | | 6/2009 | Werking | |
| 2003/0080754 A1 | * | 5/2003 | Harris et al. | 324/649 |
| 2004/0056668 A1 | * | 3/2004 | Park | 324/658 |
| 2005/0279398 A1 | * | 12/2005 | Herrick et al. | 136/235 |
| 2006/0137450 A1 | * | 6/2006 | Eskridge | 73/514.16 |
| 2006/0192565 A1 | * | 8/2006 | Yasuda et al. | 324/458 |
| 2008/0129302 A1 | * | 6/2008 | Shafai et al. | 324/458 |
| 2008/0284445 A1 | * | 11/2008 | Ogawa et al. | 324/457 |
| 2009/0219036 A1 | * | 9/2009 | Seppa et al. | 324/661 |
| 2010/0082268 A1 | * | 4/2010 | Fischer | 702/34 |
| 2012/0186347 A1 | * | 7/2012 | McNeil | 73/514.32 |

OTHER PUBLICATIONS

William A. Maryniak, Effective ESD Measurement, An Improved Instrument for Locating Static Charge Problems, Trek, Inc., Medina NY, www.trekinc.com, Copyright 2002 Trek, Inc.

(Continued)

*Primary Examiner* — Patrick Assouad
*Assistant Examiner* — Demetrius Pretlow
(74) *Attorney, Agent, or Firm* — Shumaker & Sieffert, P.A.

(57) ABSTRACT

An electromechanical system (MEMS) voltmeter. An exemplary MEMS voltmeter includes a proof mass mounted to a substrate in a teeter-totter manner. The MEMS voltmeter also includes an input voltage plate located on the substrate under a first end of the proof mass. The first input voltage plate receives a voltage from a device under test. A drive voltage plate is located on the substrate under a second end of the proof mass. A first sense input voltage plate is located on the substrate under the first end of the proof mass. A second sense voltage plate is located on the substrate under the second end of the proof mass. A rebalancing circuit receives signals from the proof mass and the first and second sense voltage plates and generates a voltage value that is equal to the root mean square (RMS) voltage of the device under test.

19 Claims, 6 Drawing Sheets

(56) References Cited

OTHER PUBLICATIONS

Dr. Maciej A. Noras, Non-contact surface charge/voltage measurements Capacitive probe—principle of operation, Trek, Inc., Medina NY, www.trekinc.com, Copyright 2002 Trek, Inc., 02034/MAN Rev. 2, 8 pages.

Dr. Maciej A. Noras, AC-Feedback Electrostatic Voltmeter Operation, Trek, Inc., Medina NY, www.trekinc.com, Copyright 2002 Trek, Inc., 0803/MAN Rev.0b, 4 pages.

Denison et al., Feedback Loop Design for an Electrostatic Voltmeter, Proceedings of the 2006 American Control Conference, Minneapolis, Minnesota, USA, Jun. 2006, WeB15.2, pp. 1215-1220.

Riehl, et al., Electrostatic Charge and Field Sensors Based on Micromechanical Resonators, Journal of Microelectormechanical Systems, vol. 12, No. 5, Oct. 2003, pp. 1057-7157.

Trek, Electrostatic Voltmeter Solutions, Control without comprosmise, Trek, Inc., Medina NY, www.trekinc.com, ISO 9001-2000 FM 56910, Jan. 2004.

* cited by examiner

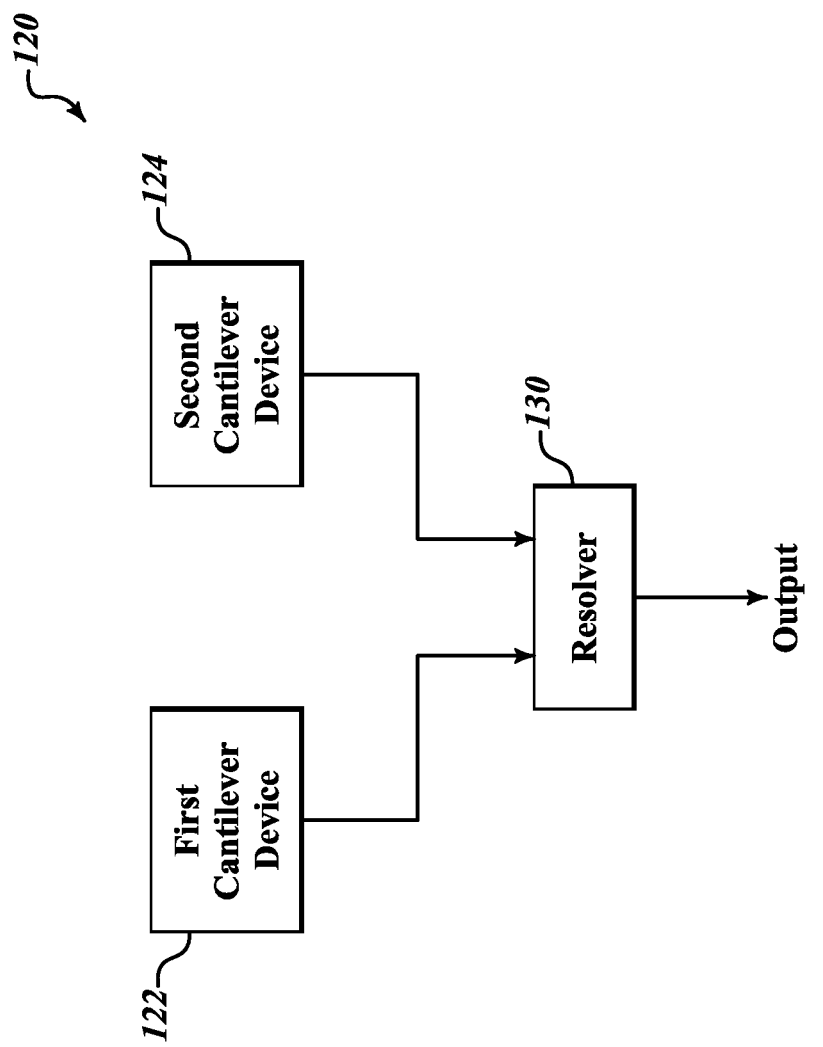

US 9,018,937 B2

MEMS-BASED VOLTMETER

BACKGROUND OF THE INVENTION

A voltmeter is an instrument used for measuring the electrical potential difference between two points in an electrical circuit.

Voltmeters are made in a wide range of styles. Instruments permanently mounted in a panel are used to monitor generators or other fixed apparatus. Portable instruments, usually equipped to also measure current and resistance in the form of a multimeter, are standard test instruments used in electrical and electronics work.

General purpose analog voltmeters may have an accuracy of a few percent of full scale, and are used with voltages from a fraction of a volt to several thousand volts. Digital meters can be made with high accuracy, typically better than 1%. Specially calibrated test instruments have higher accuracies, with laboratory instruments capable of measuring to accuracies of a few parts per million. Meters using amplifiers can measure tiny voltages of microvolts or less.

Root mean square (RMS) voltmeters are commonly used to measure AC voltages and the equivalent power of complex waveforms. Currently, RMS voltmeters have limited bandwidth and can become very complex, expensive, and large. Many RMS voltmeters currently use semiconductor diode networks to form an approximation of the absolute value of the incoming voltage. However, they are not entirely successful at doing this because of the non-zero voltage at which semiconductor diodes switch.

SUMMARY OF THE INVENTION

The present invention provides an electromechanical system (MEMS) voltmeter. An exemplary MEMS voltmeter includes a proof mass that is mounted to a substrate in a teeter-totter manner. The MEMS voltmeter also includes an input voltage plate located on the substrate under a first end of the proof mass. The first input voltage plate receives a voltage from a device under test. A drive voltage plate is located on the substrate under a second end of the proof mass. The proof mass itself is connected to the common signal return path or ground. A first sense input voltage plate is located on the substrate under the first end of the proof mass. A second sense voltage plate is located on the substrate under the second end of the proof mass. A rebalancing circuit receives signals regarding the proof mass position from the first and second sense plates and generates a drive voltage for the drive plate based on these signals. The first and second ends of the proof mass are approximately equal in mass.

In one aspect of the invention, the rebalancing circuit includes a deflection sensing component that determines an amount of deflection of the proof mass based on the received signals and a control component that generates the drive voltage value based on the determined amount of deflection. The rebalancing circuit outputs a drive voltage that corresponds to the root mean square (RMS) value of the input voltage.

An exemplary MEMS circuit overcomes non-ideal diode behavior by using basic electrostatic forces. For a constant voltage, $V_K$, applied to two plates of a capacitor, the electrostatic force of attraction between these two plates, $F_K$, is the same regardless of the sign of the voltage. Furthermore, this force goes to exactly zero at $V_K=0$.

BRIEF DESCRIPTION OF THE DRAWINGS

Preferred and alternative embodiments of the present invention are described in detail below with reference to the following drawings:

FIG. 6 is a block diagram of a voltmeter formed in accordance with another embodiment of the present invention.

DETAILED DESCRIPTION OF THE INVENTION

Figure 1:
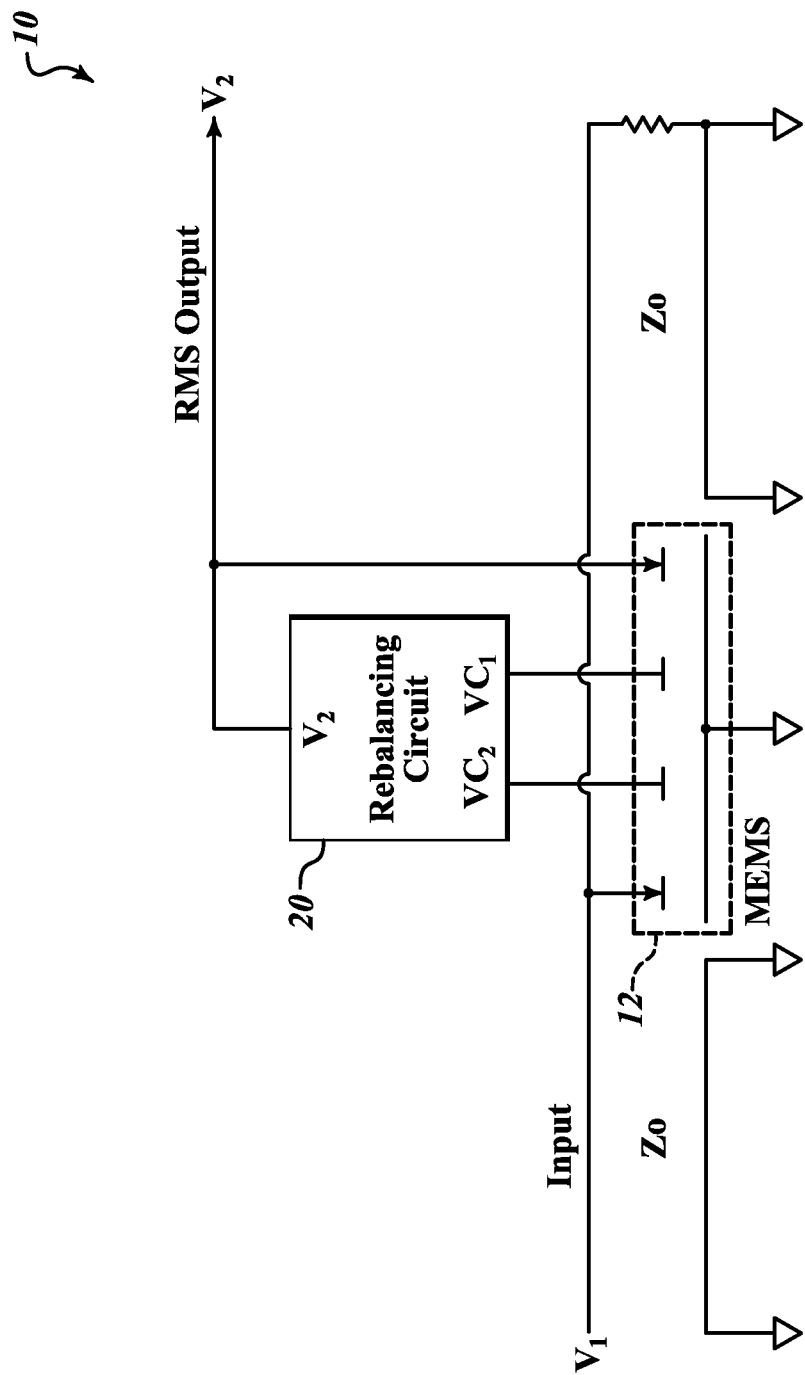
FIG. 1 is a schematic drawing of a voltmeter formed in accordance with an embodiment of the present invention.
Figure 2:
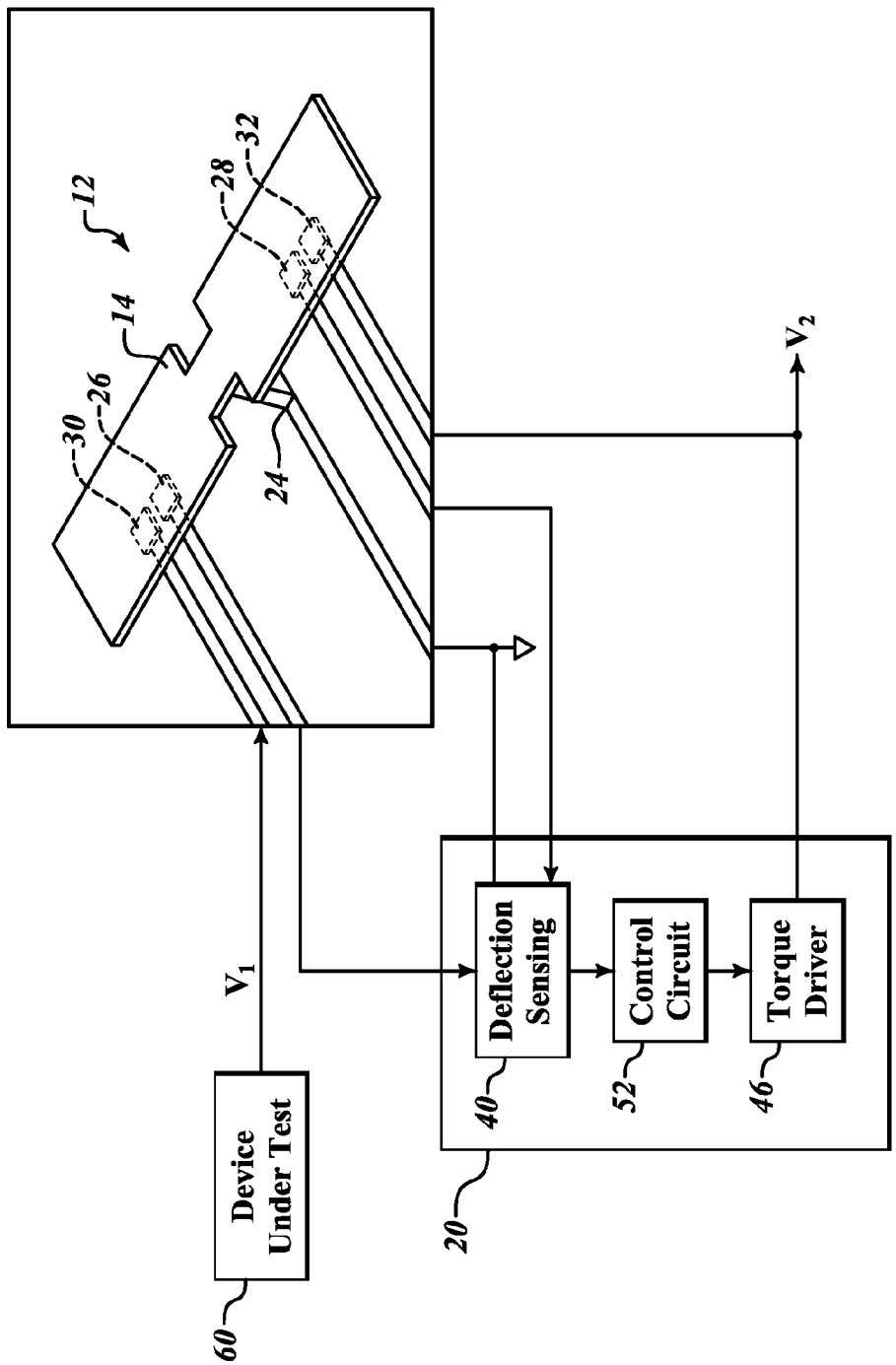
FIG. 2 is a partial perspective view of an exemplary voltmeter formed in accordance with an embodiment of the present invention.

FIGS. 1 and 2 show circuit diagrams of an exemplary voltmeter 10. The voltmeter 10 includes at least a seesaw type of microelectromechanical system (MEMS) device 12 and a rebalancing circuit 20. The MEMS device 12 receives an input voltage $V_1$ from a device under test. The rebalancing circuit 20 includes three leads connected to the MEMS device 12; two leads are sensing leads $VC_2$, $VC_1$; and one lead is a drive lead. The drive lead produces an output voltage $V_2$, which is equal to the root mean square (RMS) value of the input voltage $V_1$.

The rebalancing circuit 20 senses when the MEMS device 12 is out of balance. The rebalancing circuit 20 generates a drive voltage $V_2$ that is sent to the MEMS device 12 to put the MEMS device 12 back in balance. Because the MEMS device 12 includes a perfectly balanced teeter-totter (i.e., seesaw, proof mass) structure 14, the MEMS device 12 is incapable of sensing acceleration. However, the MEMS device 12 still requires that equal voltages be applied to drive (torque) plates in order to maintain balance of the teeter-totter structure 14. In other words, the electrostatic forces applied to the proof mass by the two torque plates must match.

$V_1$ represents the voltage applied to a first torque plate (electrical pad) (i.e., capacitor $C_1$) 30 and $V_2$ represents the voltage applied to a second torque plate (electrical pad) (i.e., capacitor $C_2$) 32. $F_1$ represents the electrostatic force generated by $V_1$ and $F_2$ represents the electrostatic force generated by $V_2$. Then, to maintain balance, the following condition must be met.

$$V_1^2(C_1/d_1)=F_1=F_2=V_2^2(C_2/d_2) \qquad (1)$$

where $d_1$ and $d_2$ are the capacitive distances from the proof mass to each respective plate. When in balance, $d_1=d_2$ and $C_1=C_2$. In this condition $$V_1^2=V_2^2. \qquad (2)$$

By forcing the structure 14 into balance, the RMS voltage of any arbitrary unknown input can be found. For example, $V_1$ is the unknown input and $V_2$ is the equivalent DC voltage that is required to balance the structure 14.

$$V_2=\sqrt{V_1^2} \qquad (3)$$

At low frequencies (below the mechanical resonance of the structure 14) the output voltage, $V_2$, is equal to the square root of the input voltage, $V_1$, squared. However, at high frequencies (well above the mechanical resonance of the structure 14, typically 1-10 kHz) the output voltage $V_2$ is equal to the square root of the mean (or time average) of the input voltage squared.

In FIG. 2, the MEMS device 12 is shown with a balanced proof mass 14 that is supported in a teeter-totter manner at a post 24 that is attached to a center point of the proof mass 14 and to a base substrate. An electrical trace connects the proof mass 14 via the post 24 to a deflection-sensing component 40 located within the rebalancing circuit 20. Also located on the base substrate below each end of the proof mass on opposing sides of the post 24 are electrical pads 26, 28 that include traces that electrically connect to the deflection-sensing component 40. The two additional electrical pads (torque plates) 30 and 32 are also located on the substrate below the ends of the proof mass 40 on opposing sides of the post 24. An electrical trace connects one of the pads 32 to a torque driver component 46 located within the rebalancing circuit 20. The other remaining electrical pad 30 also has a trace located on the substrate that connects the pad 30 to a device under test 60 for sensing an input voltage $V_1$.

The rebalancing circuit 20 also includes a control circuit component 52 that is in signal communication with the deflection-sensing component 40 and the torque driver component 46. Once the control circuit component 52 receives sensed values from the sensing pads 26 and 28 and the proof mass 14, the control circuit component 52 generates a command signal that is sent to the torque driver component 46 for instructing the torque driver component 46 to produce a voltage $V_2$ for driving the proof mass 14 back into balance so that the capacitance of or the signals generated by the sense pads 26 and 28 are equal, since $C=i/(dv/dt)$, either i, dv, or dt could be used as the signal. Thus, the output $V_2$ is equal to $V_1$.

At low voltages, the accuracy of the MEMS RMS voltmeter circuit is limited primarily by the mechanical offset to about 10 mV. (The mechanical offset represents the difference in position between the point where the teeter-totter structure 14 comes to rest in the absence of outside (electrostatic) forces and the point where the two sense plates have equal capacitance.) When $V_1$ and $V_2$ are greater than this, the accuracy is then limited by the overall offset of the electrical circuitry to, typically, about 1 mV. However, if it is only necessary to measure differences between two or more RMS input voltage levels, then it should be possible to differentiate between signal levels on the order of a microvolt or less. In this case, the sensitivity of this method is limited primarily by the electrical noise of the rebalancing circuit. However, for physically small mechanisms it could also be limited by Brownian motion. In either case, a MEMS RMS detector could be somewhat useful as an envelope detector in terahertz communications systems.

While the response of this system is limited to the response of the mechanical resonance of the MEMS structure, it can detect the equivalent RMS voltage of inputs having extremely high frequencies. Note that the input plate 30 may be connected directly to the input voltage source, $V_1$. If an amplifier is connected between the input plate 30 and $V_1$ to enhance sensitivity, then the frequency response of the amplifier will limit the frequencies to which the overall RMS voltmeter circuit can respond. Likewise, if a resistive voltage divider is connected between the input plate 30 and $V_1$ to enlarge the range of voltages to be measured, then the frequency response of the resistive voltage divider will limit the frequencies to which the overall RMS voltmeter circuit can respond. If a short wire is used to connect plate 30 directly to the input voltage, $V_1$, then the frequencies to which the lumped circuit shown in FIG. 2 can respond is limited by the lumped capacitance of plate 30 combined with the lumped resistance, capacitance, and inductance of the wire (typically less than 50 MHz).

Figure 3:
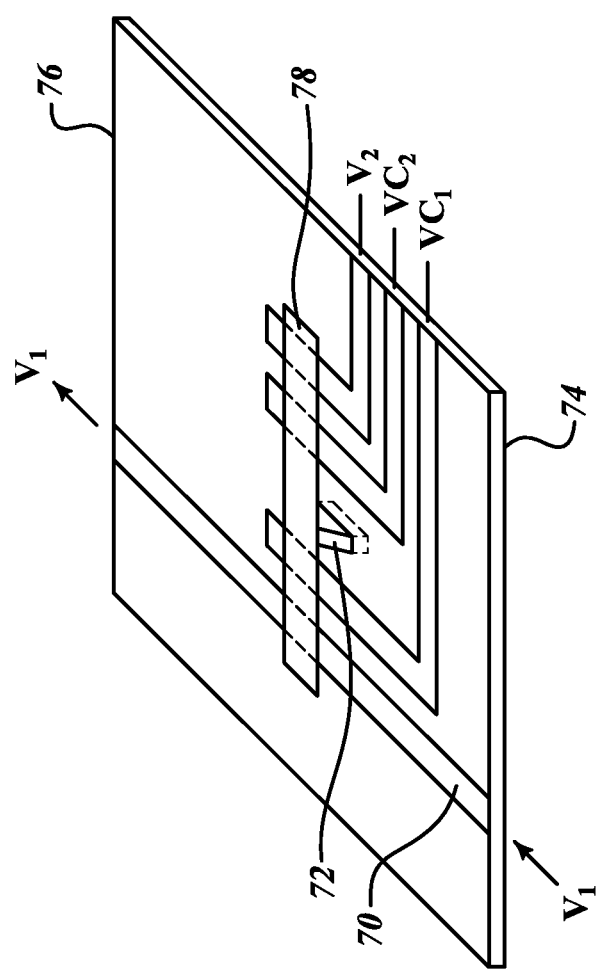
FIG. 3 is a partial perspective view of an alternate exemplary voltmeter formed in accordance with an embodiment of the present invention for use with high frequency RF voltages.

However, much larger bandwidths than this are possible if one takes into account transmission line effects. Such a distributed system is shown in FIG. 3. Note that $V_1$ is connected to a microstrip transmission line 70 that runs beneath the grounded MEMS teeter-totter 72 and above a ground plane 74. The half of the MEMS structure over the transmission line 70 acts as a capacitively-coupled grounded stub that will disturb the impedance of the transmission line, $Z_0$, at certain specific resonant frequencies. The lowest such frequency, $f_0$, is given by the equation below where c represents the speed of light and l represents length of the stub from the center of the fulcrum to the center of the input transmission line 70. (Note: it is assumed that the effective dielectric constant of the stub relative to a vacuum is unity.)

$$f_0 = c/4l \quad (4)$$

From commonly available MEMS accelerometers, it is known that a typical value for the length of the stub, l, is about 1000 μm. In this case, the value of $f_0$ is approximately 75 GHz. Such an RMS voltmeter built at these dimensions would have a frequency response from essentially DC to 75 GHz. By reducing the stub length to 75 μm, the bandwidth of the RMS voltmeter could be increased to 1 THz. It should be noted that, for a given dielectric substrate material, the impedance, $Z_0$, of the input microstrip transmission line will be significantly higher for the 75 μm design than for the 1000 μm design due to the reduced width of the microstrip transmission line. This will make matching the RF impedance of the MEMS RMS voltmeter to an external source somewhat more problematic than the 1000 μm design but it can be done and such a 75 μm design would have a 1 THz bandwidth. If wide bandwidth is not required, narrow band RMS voltmeters may be constructed to operate at specific frequencies up to an order of magnitude higher than the $f_0$ indicated by equation (3) by tuning out the effect of the proof mass stub at a specific frequency (say, by using a double stub tuner circuit). In other words, the 75 μm design could operate at specific narrow frequency bands up to about 10 THz. Such a circuit could be used as an RF power meter or as an envelope detector. By decreasing the stub length further, higher frequency operation is possible. At some point, transmission line losses and the reduced mechanical sensitivity of the MEMS structure will limit the minimum practical stub length, l. However, the point at which this happens is not yet known. It should also be appreciated that the practical operation of this circuit at terahertz frequencies may require the use of superconducting materials to minimize transmission line losses and that these superconductors may require refrigeration.

As shown in FIG. 3, the RF input is coupled into the microstrip transmission line 70 from a source in the lower left part of the drawing and the output of the microstrip transmission line 70 is near the top of the drawing. In one embodiment, the output is terminated to a load resistor, $R_L$, which has a value equal to the impedance of the transmission line, $Z_0$, in order to minimize reflections. In other embodiments, it may be advantageous to connect the transmission line output to some downstream circuit (such as a radio receiver or another instrument). In other words, the RMS voltmeter may be inserted into an RF system without significantly loading the system. In another embodiment, two or more MEMS RMS voltmeter circuits are cascaded to produce an array with additional functionality. For example, two such circuits could be cascaded to allow measurements of transmission line Voltage Standing Wave Ratio (VSWR). Such measurements are often used to match RF components (especially antennas) to each other to minimize power losses.

The RF MEMS RMS voltmeter structure shown in FIG. 3 includes three layers of conductors: the bottom ground plane 74, a middle layer 76 with the $V_1$, $V_2$, $VC_1$ and $VC_2$ conductors, and a top layer 78 with the MEMS teeter-totter that is perpendicular to the $V_1$ transmission line 70.

Figure 4:
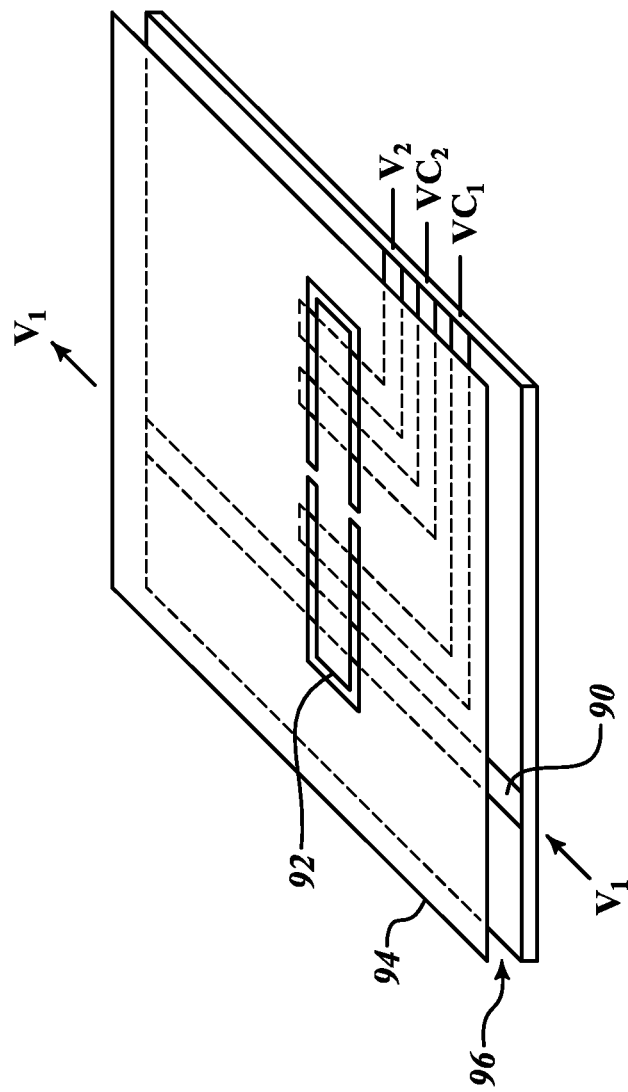
FIG. 4 is a partial perspective view of a second alternate exemplary voltmeter formed in accordance with an embodiment of the present invention for use with high frequency RF voltages.

It is possible to use a simpler two layer structure by combining the ground plane with the MEMS teeter-totter as shown in FIG. 4. Not shown in FIG. 4 is that these two planes are held parallel to each other by insulating spacers at some distance from the MEMS structure. This arrangement replaces the shorted stub of FIG. 3 with a slot cut out of the ground plane having a length l from the middle of a transmission line 90 to the middle of the contact between the teeter-totter 92 and the ground plane 94. The lowest frequency resonance of this structure is the same as the structure of FIG. 3 and is described by equation (3). In this structure, a vacuum (or gas) 96 is used as the dielectric for the microstrip transmission line 90 which reduces dielectric losses. However, the narrow contact between the teeter-totter 92 and the ground plane 94 greatly increases losses.

Figure 5:
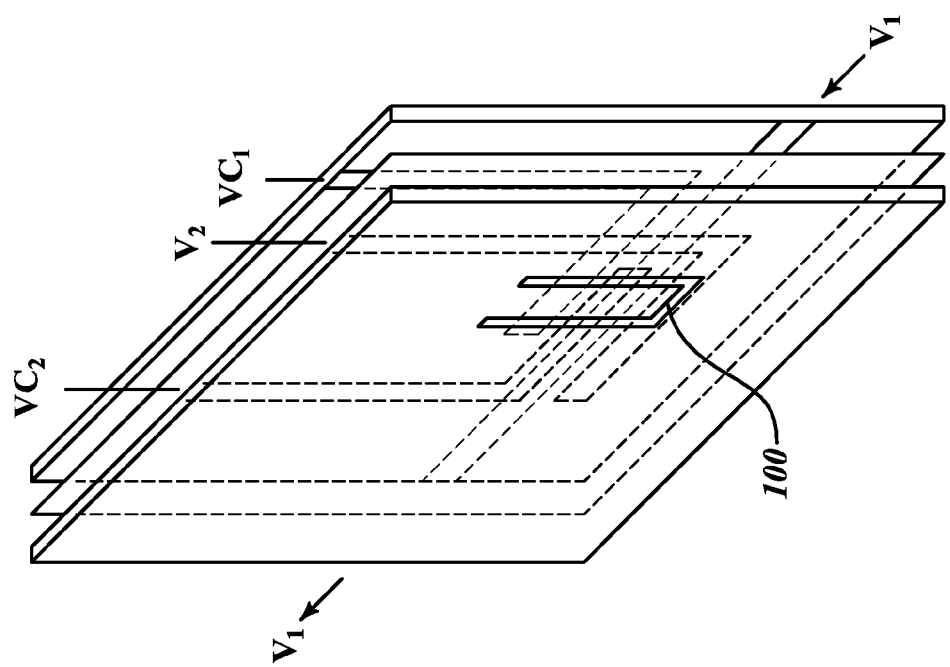
FIG. 5 is a partial perspective view of a third alternate exemplary voltmeter formed in accordance with an embodiment of the present invention for use with high frequency RF voltages.

In fact, the contact between the teeter-totter fulcrum and the ground plane in both of these approaches, shown in FIGS. 3 and 4, causes significant losses at high frequencies. In one embodiment, these losses are mitigated by using a three layer structure as shown in FIG. 5 which uses a single cantilever 100 as the proof mass instead of the teeter-totter. Here, $V_1$ is applied to the bottom of the proof mass while $V_2$ is applied to the top. Likewise, $VC_1$ is applied to the bottom of the proof mass while $VC_2$ is applied to the top. The functioning of this RF MEMS RMS voltmeter is the same as before except that (1) there is a much better electrical connection between the proof mass and the ground plane and (2) this structure is not balanced and will be sensitive to acceleration (g's). Therefore, it will be necessary to mitigate this sensitivity in some manner. In the embodiment shown in FIG. 5, the device is positioned to mechanically maintain the structure in a 0 g field. In other words the proof mass hangs from the flexures in a pendulum manner (gravitational force is parallel to a plane of the device.

In another embodiment as shown in FIG. 6, the effects of acceleration (or gravity) are cancelled out. A device 120 includes a first cantilever device 122 and a second cantilever device 124 both in signal communication with a resolver device 130. The cantilever devices 122, 124 are identical and can operate in any number of orientations provided both devices 122, 124 are in the same orientation. The first cantilever device 122 receives the input from the device under test. The second cantilever device 124 does not. Thus, the second cantilever device 124 is used to measure any force due to acceleration. The resolver device 130 removes the force measured by the second cantilever device 124 from the rebalance force applied to the first cantilever device 122 to produce the output that is equal to the input voltage.

In all of the preceding discussion, it has been assumed that the values of the input and output capacitors, $C_1$ and $C_2$, are the same. However, this was done only to simplify the discussion and is not strictly necessary. In principle, circuit gain (or attenuation) may be achieved by adjusting the ratio of $C_1$ to $C_2$. For example, consider the case where $d=d_1=d_2$ and $C_1=4C_2$. (In other words, $C_1$ has four times more area than $C_2$.) In this case $$V_1^2(4C_2/d)=F_1=F_2=V_2^2(C_2/d) \quad (5)$$

and $$4V_1^2=V_2^2 \quad (6)$$

which reduces to the following:

$$V_2=2\sqrt{V_1^2} \quad (7)$$

In other words, it takes twice as much voltage on $V_2$ to balance the mechanism. In the arrangement of FIG. 5, the distances $d_1$ and $d_2$ may also be varied.

In one embodiment, the low frequency rebalancing circuit 20 is located on the same substrate as the MEMS mechanism. By integrating the circuit 20 on to a small die, it is mounted on the same substrate as the mechanism. By using a semiconductor (such as silicon) as the substrate, the rebalancing circuit 20 could be built into the substrate.

It is not strictly necessary to use capacitive plates to sense the displacement of the cantilever (i.e., proof mass) in the MEMS voltmeter approach of FIG. 5. In this instance, deflection could also be sensed by one or more piezoresistive sensors imbedded in a plane of crystalline semiconductor. The thin plane of semiconductor material would be coated on the bottom surface facing the transmission line, and on the top of the cantilever, with an appropriate conductor. By removing the $VC_1$ and $VC_2$ sense plates, the length of the RF slot in the ground plane could be reduced and the bandwidth of the signals to which the voltmeter responds subsequently increased.

In another embodiment, optical means are employed to accomplish the same thing. In one embodiment, thin optical channels (similar to optical fibers) are imbedded into the cantilever, perpendicular to the transmission line, and the optical losses induced by bending could be measured. Alternately, coupling losses of an optical channel network which propagates light through the cantilever, parallel to the transmission line, are measured. In another embodiment, a laser beam is directed between the MEMS beam and the transmission line, perpendicular to the transmission line, and the optical loss induced by the deflection of the cantilever measured.

While the preferred embodiment of the invention has been illustrated and described, as noted above, many changes can be made without departing from the spirit and scope of the invention. Accordingly, the scope of the invention is not limited by the disclosure of the preferred embodiment. Instead, the invention should be determined entirely by reference to the claims that follow.

The embodiments of the invention in which an exclusive property or privilege is claimed are defined as follows:

1. A voltmeter comprising:
a proof mass electrically coupled to an effective ground;
an input voltage plate located on a substrate adjacent a first end of the proof mass, wherein the input voltage plate is configured to receive a voltage from a device under test;
a drive voltage plate located on the substrate adjacent a second end of the proof mass;
a sensing device configured to sense position of the proof mass; and
a rebalancing circuit configured to receive signals from the sensing device and generate a drive voltage value for the drive voltage plate based on the received signals and the effective ground.

2. The voltmeter of claim 1, wherein the sensing device comprises:
a first sense input voltage plate located on the substrate adjacent the first end of the proof mass; and a second sense voltage plate located on the substrate adjacent the second end of the proof mass.

3. The voltmeter of claim 1, wherein the first and second ends of the proof mass are approximately equal in mass.

4. The voltmeter of claim 3, wherein the rebalancing circuit comprises:
a deflection sensing component configured to determine an amount of deflection of the proof mass based on the received signals; and
a control component configured to generate the drive voltage value based on the determined amount of deflection.

5. The voltmeter of claim 4, wherein the rebalancing circuit is further configured to output a root mean square (RMS) voltage value that corresponds to the drive voltage.

6. The voltmeter of claim 1, further comprising a post configured to attach to an approximate center of the proof mass.

7. The voltmeter of claim 6, wherein the substrate comprises a dielectric, further comprising a ground plane located below the dielectric.

8. The voltmeter of claim 1, further comprising a ground plane located in the same layer as the proof mass.

9. The voltmeter of claim 1, wherein the proof mass is mounted in a teeter-totter manner.

10. The voltmeter of claim 1, wherein the proof mass is mounted in a cantilever manner in a pendulous orientation.

11. The voltmeter of claim 1, wherein the proof mass is mounted in a cantilever manner, further comprising:
a second proof mass; and
sensing device configured to sense position of the proof mass,
wherein the proof mass is configured approximately identical to the first proof mass.

12. A system comprising:
the voltmeter of claim 1, and
the device under test.

13. A method for sensing root mean square (RMS) voltage of a device under test, the method comprising:
deflecting a proof mass based on an input voltage from the device under test received at an input voltage plate located on a substrate adjacent a first end of the proof mass;
receiving a first signal from the proof mass;
receiving at least one signal associated with position of the proof mass;
generating a drive voltage signal based on the received at least one signal; and
sending the drive voltage signal to a drive voltage plate located on the substrate adjacent the second end of the proof mass,
wherein the generated drive voltage value is an RMS voltage that corresponds to the input voltage.

14. The method of claim 13, wherein the at least one signal comprises:
a signal from a first sense voltage plate located on the substrate adjacent the first end of the proof mass;
a signal from a second sense voltage plate located on the substrate adjacent a second end of the proof mass.

15. The method of claim 13, wherein the first and second ends of the proof mass are approximately equal in mass.

16. The method of claim 15, wherein generating comprises:
determining an amount of deflection of the proof mass based on the received signals; and
generating the drive voltage value based on the determined amount of deflection.

17. The method of claim 13, further comprising:
providing, by the device under test, the input voltage.

18. A voltmeter comprising:
a proof mass electrically coupled to an effective ground;
an input voltage plate located on a substrate at least adjacent a first end of the proof mass, wherein the input voltage plate is configured to receive a voltage from a device under test;
a drive voltage plate located on the substrate adjacent a second end of the proof mass;
a sensing device configured to sense position of the proof mass; and
a rebalancing circuit configured to receive signals from the proof mass and the first and second sense voltage plates and generate a drive voltage value for the drive voltage plate based on the received signals and the effective ground,
wherein the sensing device comprises at least one piezoresistive sensor, optical sensor, or pendulous sensor.

19. A system comprising:
the voltmeter of claim 18; and
the device under test.

* * * * *